United States Patent
Ochiai

(10) Patent No.: US 12,369,414 B2
(45) Date of Patent: Jul. 22, 2025

(54) PHOTOELECTRIC CONVERSION DEVICE

(71) Applicant: CANON KABUSHIKI KAISHA, Tokyo (JP)

(72) Inventor: Kei Ochiai, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 18/433,873

(22) Filed: Feb. 6, 2024

(65) Prior Publication Data
US 2024/0282787 A1    Aug. 22, 2024

(30) Foreign Application Priority Data
Feb. 16, 2023  (JP) .................. 2023-022557

(51) Int. Cl.
| H10F 39/00 | (2025.01) |
| H04N 25/79 | (2023.01) |
| H10F 39/18 | (2025.01) |
| G01S 17/89 | (2020.01) |

(52) U.S. Cl.
CPC ......... *H10F 39/8037* (2025.01); *H04N 25/79* (2023.01); *H10F 39/18* (2025.01); *G01S 17/89* (2013.01)

(58) Field of Classification Search
CPC ........ H01L 27/14612; H01L 27/14643; H04N 25/79
See application file for complete search history.

(56) References Cited

U.S. PATENT DOCUMENTS

| 10,015,430 | B2 | 7/2018 | Kobayashi | |
| 10,531,033 | B2 | 1/2020 | Morita | |
| 10,609,243 | B2 | 3/2020 | Ochiai | |
| 11,039,057 | B2 | 6/2021 | Ochiai | |
| 11,489,999 | B2 | 11/2022 | Ochiai | |
| 2020/0350345 | A1 | 11/2020 | Hiramatsu | |
| 2021/0235036 | A1* | 7/2021 | Kitano | H04N 25/79 |
| 2023/0071929 | A1* | 3/2023 | Mochizuki | H04N 25/60 |
| 2024/0243154 | A1* | 7/2024 | Katayama | H04N 25/77 |

FOREIGN PATENT DOCUMENTS

| JP | 2021-129265 A | 9/2021 |
| JP | 2022-147587 A | 10/2022 |
| JP | 2022-157560 A | 10/2022 |
| WO | 2019/093150 A1 | 5/2019 |

\* cited by examiner

*Primary Examiner* — Thanh Luu
(74) *Attorney, Agent, or Firm* — VENABLE LLP

(57) ABSTRACT

A photoelectric conversion device including a plurality of pixels, each of the plurality of pixels including: a photoelectric conversion unit configured to generate charges according to incident light; a charge holding unit; a first transfer transistor configured to transfer charges from the photoelectric conversion unit to the charge holding unit; a second transfer transistor configured to transfer charges from the charge holding unit to a first node; and a third transfer transistor configured to transfer charges from the photoelectric conversion unit to a second node. In one of the plurality of pixels, first reading processing of reading a gradation signal indicating a light amount of the incident light based on the charges transferred to the first node and second reading processing of reading an event signal indicating a change in the light amount of the incident light based on the charges transferred to the second node are performed in parallel.

20 Claims, 9 Drawing Sheets

PHOTOELECTRIC CONVERSION DEVICE

BACKGROUND OF THE INVENTION

Field of the Invention

The present disclosure relates to a photoelectric conversion device.

Description of the Related Art

Japanese Patent Application Laid-Open No. 2021-129265 discloses a sensor device capable of generating an event signal and a gradation signal. In the sensor device disclosed in Japanese Patent Application Laid-Open No. 2021-129265, selection of a pixel for reading an event signal and selection of a pixel for reading a gradation signal are performed at different timings in a row sequential manner.

When the length of a period in which the event can be detected is not sufficiently secured, an event detection omission may occur. Therefore, in a photoelectric conversion device capable of reading an event signal, there is a case where it is required to reduce the possibility of the event detection omission.

SUMMARY OF THE INVENTION

It is an object of the present disclosure to provide a photoelectric conversion device in which the possibility of event detection omission is reduced.

According to a disclosure of the present specification, there is provided a photoelectric conversion device including a plurality of pixels, each of the plurality of pixels including: a photoelectric conversion unit configured to generate charges according to incident light; a charge holding unit; a first transfer transistor configured to transfer charges from the photoelectric conversion unit to the charge holding unit; a second transfer transistor configured to transfer charges from the charge holding unit to a first node; and a third transfer transistor configured to transfer charges from the photoelectric conversion unit to a second node. In one of the plurality of pixels, first reading processing of reading a gradation signal indicating a light amount of the incident light based on the charges transferred to the first node and second reading processing of reading an event signal indicating a change in the light amount of the incident light based on the charges transferred to the second node are performed in parallel.

Further features of the present invention will become apparent from the following description of exemplary embodiments with reference to the attached drawings.

DESCRIPTION OF THE EMBODIMENTS

Figure 1:
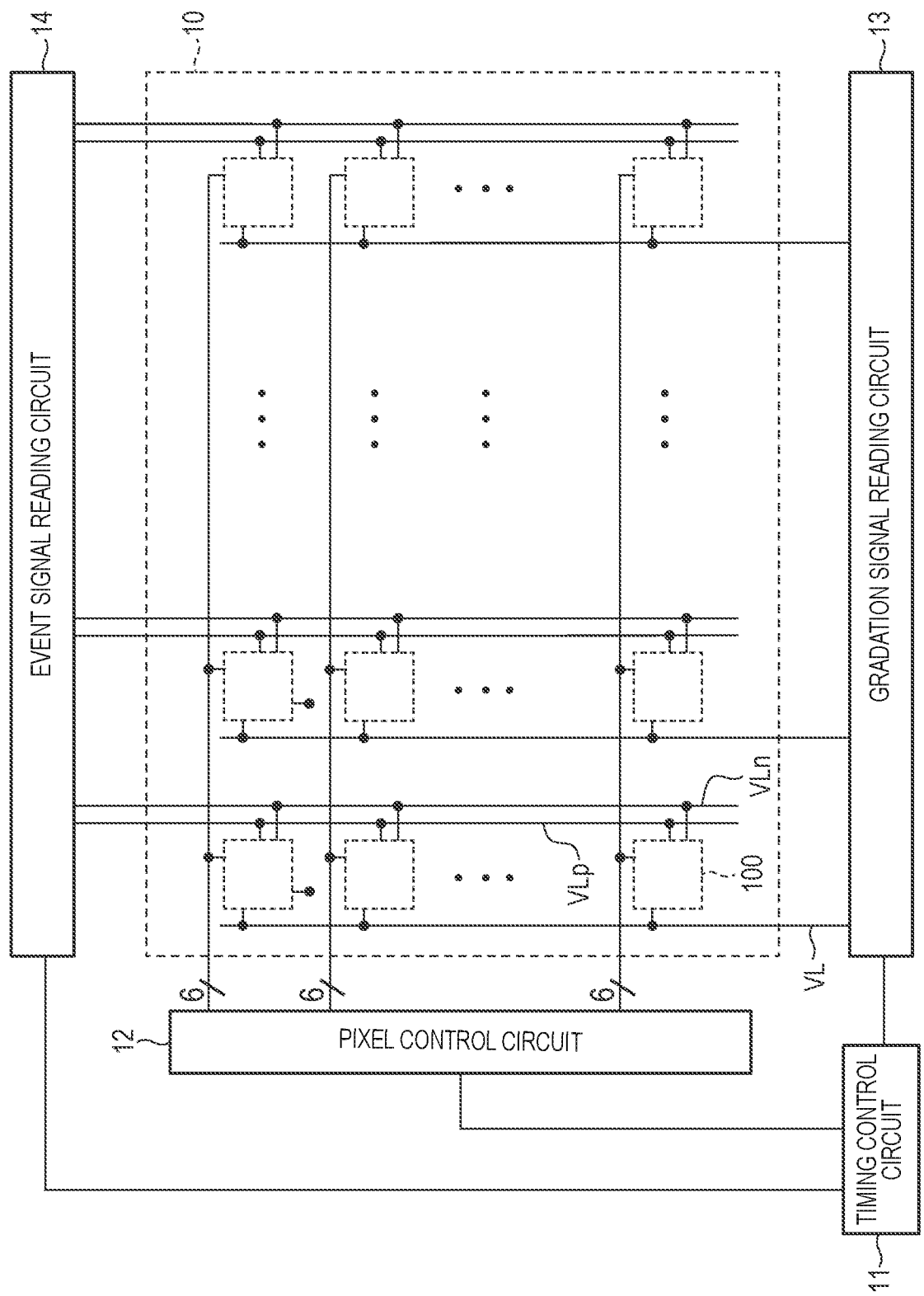
FIG. 1 is a block diagram illustrating a schematic configuration of a photoelectric conversion device according to a first embodiment.

Preferred embodiments of the present invention will now be described in detail in accordance with the accompanying drawings. In the drawings, the same or corresponding elements are denoted by the same reference numerals, and the description thereof may be omitted or simplified.

In the following first to fourth embodiments, an imaging device capable of detecting an event will be mainly described as an example of a photoelectric conversion device. However, the photoelectric conversion device of each embodiment is not limited to the imaging device, and can be applied to other photodetection devices based on photoelectric conversion. Examples of other photodetection devices include a ranging device and a photometry device. The ranging device may be, for example, a focus detection device, a distance measuring device using a time-of-flight (TOF), or the like. The photometry device may be a device for measuring the light amount incident on the device.

First Embodiment

FIG. 1 is a block diagram illustrating a schematic configuration of a photoelectric conversion device according to the present embodiment. The photoelectric conversion device includes a pixel array 10, a timing control circuit 11, a pixel control circuit 12, a gradation signal reading circuit 13, and an event signal reading circuit 14.

The pixel array 10 includes a plurality of pixels 100 arranged to form a plurality of rows and a plurality of columns, each of the plurality of pixels outputting a signal corresponding to incident light by photoelectric conversion. Each of the plurality of pixels 100 includes a photoelectric conversion unit that generates and accumulates signal charges based on incident light. Microlenses and color filters may be disposed on the pixels 100. Each of the plurality of pixels 100 can output a gradation signal indicating the amount of incident light and an event signal indicating a change in the amount of incident light. The event signal is a signal generated when an event in which the light amount rapidly changes is detected in each pixel 100. This event may be, for example, a local light amount change caused by a change in the position of an object within the photographing area.

The timing control circuit 11 supplies the pixel control circuit 12, the gradation signal reading circuit 13, and the event signal reading circuit 14 with a control signal indicating the operation timing of each unit.

The pixel control circuit 12 includes a shift register, a gate circuit, a buffer circuit, and the like. The pixel control circuit 12 outputs a plurality of control signals for controlling the operation of the plurality of pixels 100 via control lines arranged for each row of the pixel array 10 based on the control signal from the timing control circuit 11. The control lines are arranged to extend in a first direction (horizontal direction in FIG. 1). The number of control lines may be plural per row. In the present embodiment, the number of control lines is six per row.

In each column of the pixel array 10, output lines VL, VLp, and VLn are arranged so as to extend in a second direction (vertical direction in FIG. 1) intersecting with the first direction. Each of the output lines VL, VLp, and VLn is connected to the pixels 100 arranged in the second direction, and forms a signal line common to the pixels 100. The output line VL of each column is connected to the gradation signal reading circuit 13, and the output lines VLp and VLn of each column are connected to the event signal reading circuit 14.

Figure 2:
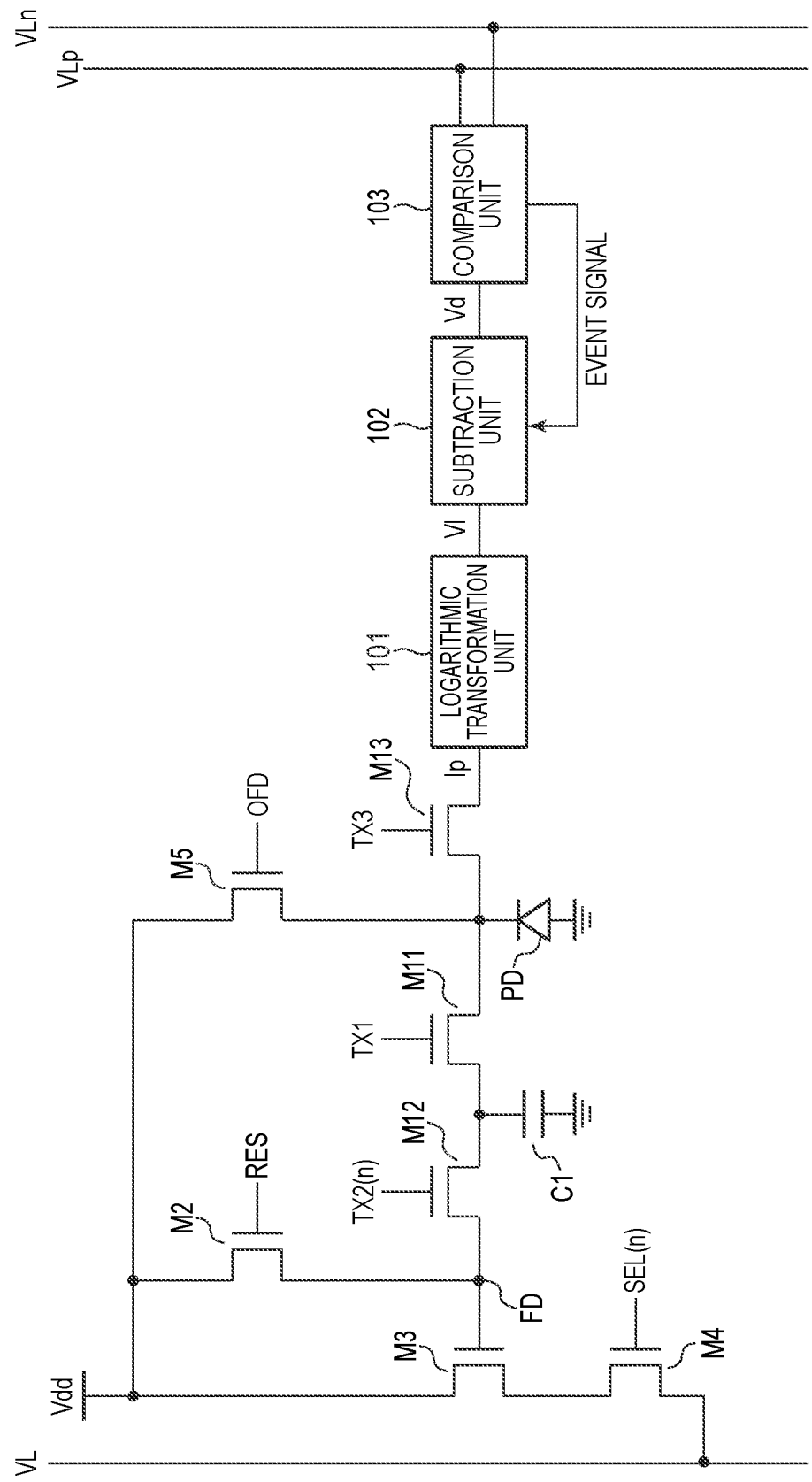
FIG. 2 is a circuit diagram illustrating a configuration example of a pixel according to the first embodiment.

FIG. 2 is a circuit diagram illustrating a configuration example of the pixel 100 according to the present embodiment. The pixel 100 includes a photoelectric conversion unit PD, a charge holding unit C1, a first transfer transistor M11, a second transfer transistor M12, a reset transistor M2, an amplification transistor M3, a selection transistor M4, and a discharging transistor M5. In addition, the pixel 100 includes a third transfer transistor M13, a logarithmic transformation unit 101, a subtraction unit 102, and a comparison unit 103.

Each transistor in the pixel 100 is constituted by a MOS transistor. A control signal for controlling each transistor is input from the pixel control circuit 12 to a gate of corresponding transistor via a control line.

The photoelectric conversion unit PD is, for example, a photodiode. The photoelectric conversion unit PD photoelectrically converts incident light and accumulates charges generated by photoelectric conversion. The anode of the photoelectric conversion unit PD is connected to a ground node. The cathode of the photoelectric conversion unit PD is connected to the source of the first transfer transistor M11, the source of the third transfer transistor M13, and the source of the discharging transistor M5.

The drain of the first transfer transistor M11 is connected to the charge holding unit C1 and the source of the second transfer transistor M12. The charge holding unit C1 includes a capacitance component and has a function of holding charges transferred from the photoelectric conversion unit PD. In FIG. 2, the capacitance component of the charge holding unit C1 is equivalently illustrated by a circuit symbol of a capacitor element.

The drain of the second transfer transistor M12 is connected to the source of the reset transistor M2 and the gate of the amplification transistor M3. A node (first node) to which the drain of the second transfer transistor M12, the source of the reset transistor M2, and the gate of the amplification transistor M3 are connected is a floating diffusion FD. The floating diffusion FD includes a capacitance component (floating diffusion capacitance) and has a function of holding charges transferred from the photoelectric conversion unit PD. The floating diffusion capacitance includes parasitic capacitance of an electrical path from the second transfer transistor M12 to the amplification transistor M3 via the floating diffusion FD.

The drain of the reset transistor M2, the drain of the amplification transistor M3, and the drain of the discharging transistor M5 are connected to a power supply potential node Vdd to which a power supply potential is supplied. The source of the amplification transistor M3 is connected to the drain of the selection transistor M4. The source of the selection transistor M4 is connected to the output line VL. A constant current source (not illustrated) is connected to the output line VL.

A control signal TX1 is input to the gate of the first transfer transistor M11. The first transfer transistor M11 is controlled based on the control signal TX1, and transfers charges accumulated in the photoelectric conversion unit PD to the charge holding unit C1 by being turned on. The charge holding unit C1 holds charges transferred from the photoelectric conversion unit PD.

A control signal TX2(n) is input to the gate of the second transfer transistor M12. The second transfer transistor M12 is controlled by the control signal TX2(n), and transfers the charges held in the charge holding unit C1 to the floating diffusion FD by being turned on. That is, the amplification transistor M3 functions as an amplification unit, and the floating diffusion FD functions as an input node of the amplification unit, the input node receiving the charges transferred from the charge holding unit C1. Note that "(n)" at the end of the reference character of the control signal indicates the row number of the pixel 100 to which the control signal is input.

A control signal SEL(n) is input to the gate of the selection transistor M4. The selection transistor M4 is controlled by a control signal SEL(n), and turns on to connect the source of the amplification transistor M3 and the output line VL. Thus, the amplification transistor M3 and the constant current source (not illustrated) function as a source follower. In this case, a gradation signal based on the potential of the floating diffusion FD is output to the gradation signal reading circuit 13 via the output line VL.

A control signal RES is input to the gate of the reset transistor M2. The reset transistor M2 is controlled by a control signal RES and is turned on to reset the potential of the floating diffusion FD.

A control signal OFD is input to the gate of the discharging transistor M5. The discharging transistor M5 is controlled by the control signal OFD and turns on to discharge the charges accumulated in the photoelectric conversion unit PD to the power supply potential node Vdd.

The discharging transistor M5 is controlled to be turned on or off collectively in all pixels. The discharging transistor M5 is turned from the on-state to the off-state collectively in all the pixels, thereby ending the discharging at the same time in all the pixels. Thus, the discharging transistor M5 has a function of controlling the start time of exposure in the global electronic shutter. The global electronic shutter is an operation in which start and end of shutter of a plurality of effective pixels receiving incident light among the plurality of pixels are collectively performed. However, in the case where not only a plurality of effective pixels but also a light-shielded pixel are provided, each of the shutter start and the shutter end may be collectively performed in the light-shielded pixel and the plurality of effective pixels. The light-shielded pixels include both or one of an optical black pixel having a light-shielded photoelectric conversion element and a dummy pixel having no photoelectric conversion element and having the same pixel circuit as the effective pixel.

The first transfer transistor M11 is controlled to be turned on or off collectively in all pixels. The first transfer transistor M11 has a function of transferring charges accumulated in the photoelectric conversion unit PD to the charge holding unit C1 by turning on all the pixels collectively and turning off all the pixels collectively thereafter, and controlling the end time of exposure in the global electronic shutter.

The drain of the third transfer transistor M13 is connected to the input node (second node) of the logarithmic transformation unit 101. A control signal TX3 is input to the gate of the third transfer transistor M13. The third transfer transistor M13 is controlled by the control signal TX3. When the third transfer transistor M13 is on, the photocurrent Ip based on the charges generated by the photoelectric conversion by the photoelectric conversion unit PD is transferred to the logarithmic transformation unit 101. The photocurrent Ip has a current amount corresponding to the amount of incident light.

Note that the terms "source" and "drain" of each transistor may vary depending on the conductivity type of each transistor or the target function. In other words, some or all of names of a source and a drain may be reversed.

The logarithmic transformation unit 101 generates a potential corresponding to the photocurrent Ip and converts the potential into a logarithmic potential Vl by performing logarithmic function-like potential conversion. This expands the dynamic range. The logarithmic transformation unit 101 outputs the logarithmic potential Vl to the subtraction unit 102. Note that, the logarithmic transformation processing is not essential.

The subtraction unit 102 generates a difference potential Vd by subtracting a reference potential Vr (reference signal) from the logarithmic potential Vl. The difference potential Vd is output to the comparison unit 103.

The comparison unit 103 compares the difference potential Vd with a plurality of predetermined threshold values, and outputs the comparison result as an event signal. The plurality of threshold values includes two of a positive threshold value (first threshold value) and a negative threshold value (second threshold value). When the difference potential Vd is greater than the positive threshold value or when the difference potential Vd is less than the negative threshold value, occurrence of an event is detected. When the difference potential Vd is greater than the positive threshold value, the comparison unit 103 outputs the event signal to the event signal reading circuit 14 via the output line VLp. When the difference potential Vd is less than the negative threshold value, the comparison unit 103 outputs the event signal to the event signal reading circuit 14 via the output line VLn. Thus, the comparison unit 103 operates to output the event signal when the amount of change in the amount of incident light is out of a range defined by the two threshold values (when an event occurs), and not output the event signal when the amount of change is within a range defined by the two threshold values (when no event occurs). Further, by performing comparison using the positive threshold value and the negative threshold value, the comparison unit 103 can output an event in which the light amount increases and an event in which the light amount decreases as different output signals to the event signal reading circuit 14 via different output lines.

Since an event signal is a signal obtained at a timing independent of a frame synchronization signal in a general frame-based image sensor, the event signal has a high temporal resolution. The event signal is output to the event signal reading circuit 14 and also to the subtraction unit 102, and is used for updating the reference potential Vr. The subtraction unit 102 holds the logarithmic potential Vl at the time of detection of the event and uses it as the reference potential Vr in the next subtraction processing. That is, the subtraction unit 102 has a function of subtracting the reference potential Vr corresponding to the logarithmic potential in the past from the logarithmic potential Vl that is input at a certain time to generate the difference potential Vd indicating the temporal change of the signal. With the above configuration, the logarithmic transformation unit 101, the subtraction unit 102, and the comparison unit 103 can detect the increase or decrease of the light amount as a spike-shaped event signal.

As described above, the gradation signal reading circuit 13 performs first reading processing of reading the gradation signal output to the output line VL, and the event signal reading circuit 14 performs second reading processing of reading the event signal output to the output lines VLp and VLn. The gradation signal reading circuit 13 performs signal processing such as analog-to-digital conversion on the gradation signal and outputs the signal to a signal processing circuit (not illustrated) in the photoelectric conversion device or a signal processing circuit outside the photoelectric conversion device. The event signal reading circuit 14 performs signal processing such as analog-to-digital conversion on the event signal and outputs the signal to a signal processing circuit (not illustrated) in the photoelectric conversion device or a signal processing circuit outside the photoelectric conversion device.

Figure 3:
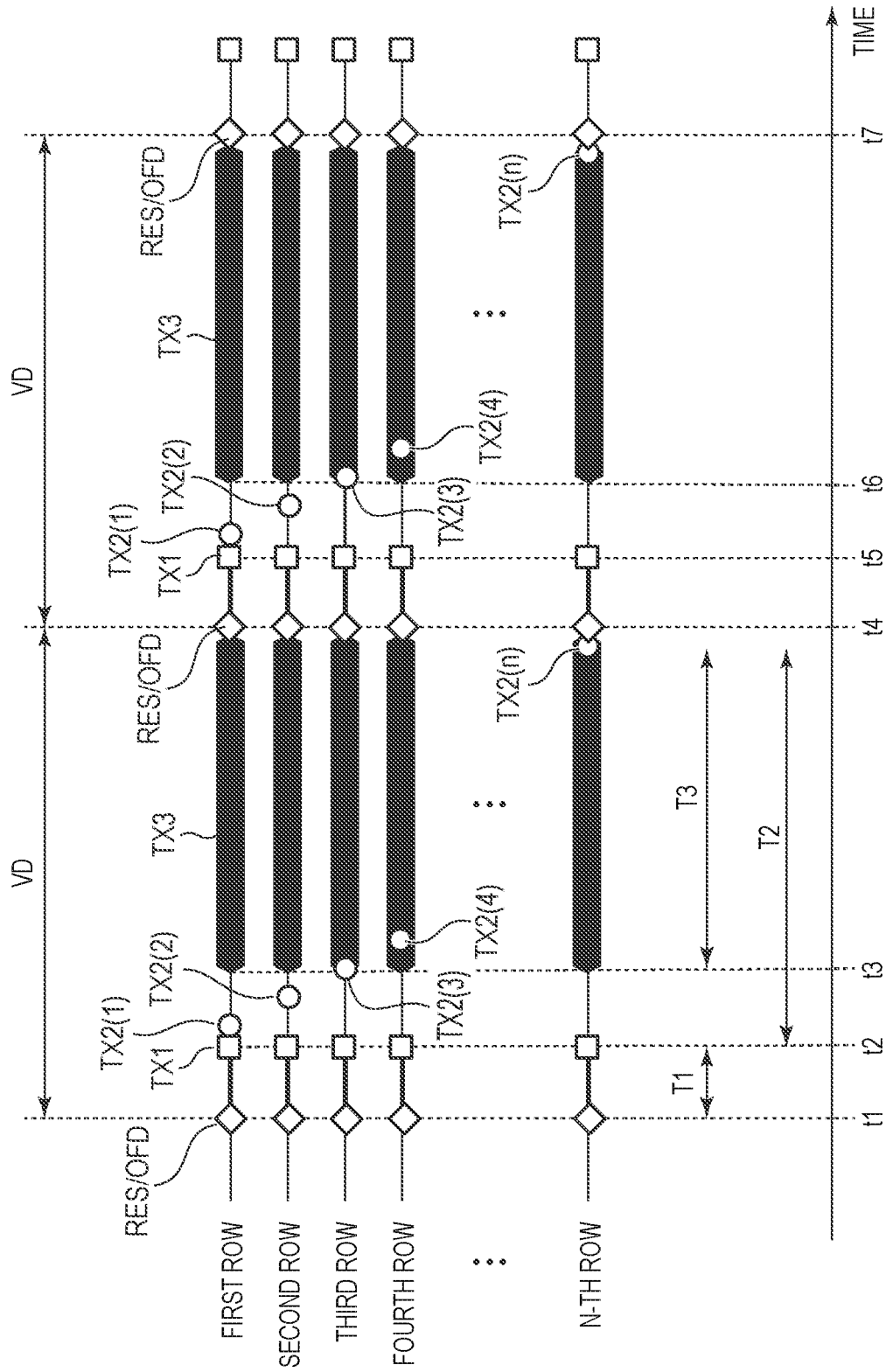
FIG. 3 is a timing chart illustrating an outline of a driving method of the photoelectric conversion device according to the first embodiment.
Figure 4:
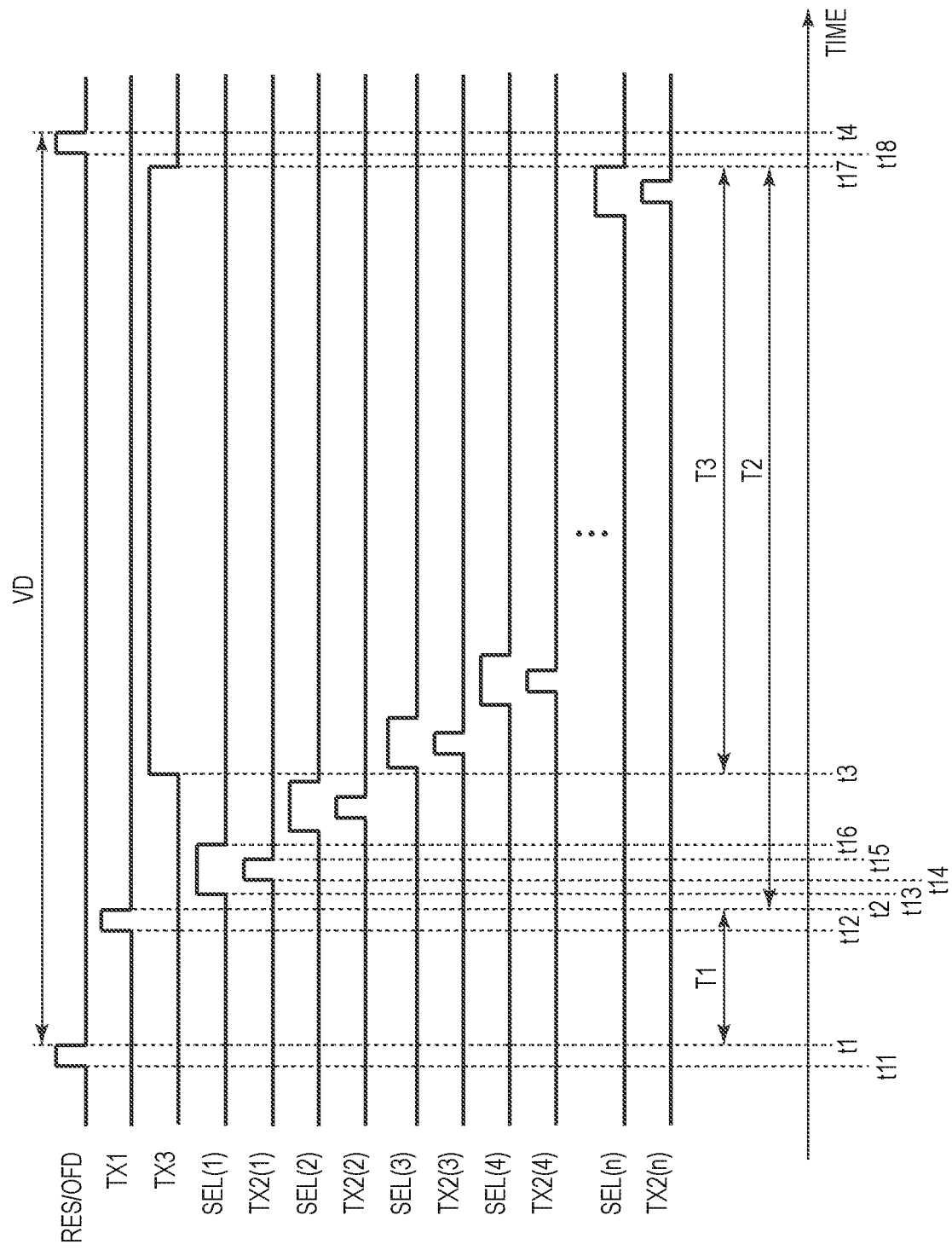
FIG. 4 is a timing chart illustrating the driving method of the photoelectric conversion device according to the first embodiment.

FIG. 3 is a timing chart illustrating an outline of a driving method of the photoelectric conversion device according to the present embodiment. FIG. 4 is a timing chart illustrating the driving method of the photoelectric conversion device according to the present embodiment in more detail.

First, an outline of a driving method of the photoelectric conversion device will be described with reference to FIG. 3. FIG. 3 illustrates timings at which the levels of the control signals supplied to the pixels 100 in the first row, the second row, the third row, the fourth row, and the n-th row in the pixel array 10 change, and periods of charge accumulation and signal reading.

Time t1 is a time at which charge accumulation for generation of the gradation signal starts. After the reset transistor M2 and the discharging transistor M5 of each row are turned on, they are turned off at the time t1. Time t2 is a time at which charge accumulation for generation of the gradation signal ends. That is, the time t2 is a time at which the first transfer transistor M11 of each row is turned off after being temporarily turned on for charge transfer. A period T1 between the time t1 and the time t2 indicates a charge accumulation period for generating the gradation signal. The charge accumulation period for generating the gradation signal is the same for each row, and the gradation signal is generated by the global electronic shutter.

After the time t2, the second transfer transistor M12 is turned on in a row sequential manner from the first row to the n-th row, and gradation signals based on the charges accumulated in the period T1 are read (first reading processing). A period T2 in FIG. 3 indicates a period in which gradation signals are read. At time t3, the third transfer transistor M13 of each row is turned on, and event detection and event signal reading (second reading processing) are started. A period T3 in FIG. 3 indicates a period in which an event is detected and an event signal is read. The event detection period and the event signal reading period are the same for each row. At least part of the period T2 and the period T3 overlap with each other. That is, in at least one pixel 100, reading of the gradation signal and detection of an event and reading of an event signal are performed in parallel.

Time t4 is a time at which the reset transistor M2 and the discharging transistor M5 of each row are turned on and then turned off. A period VD between the time t1 and the time t4 in FIG. 3 indicates one cycle in which the gradation signals are read and the event signal is read. The same operation is repeated after the time t4. That is, since the same operation is performed in a period VD from the time t4 to time t7 in FIG. 3, description thereof will be omitted.

Next, the method of driving the photoelectric conversion device will be described in detail with reference to FIG. 4. FIG. 4 illustrates a change in the level of each control signal in the vicinity of one period VD (from the time t1 to the time t4) in FIG. 3. That is, FIG. 4 illustrates changes in levels of the control signals RES, OFD, TX1, TX3, SEL(1) to SEL (n), and TX2(1) to TX2(n). Note that a transistor corresponding to each control signal is in an on-state when each control signal is at the high level, and a transistor corresponding to each control signal is in an off-state when each control signal is at the low level. Further, the control signals to which the row numbers of "(1)" to "(n)" are added indicate the levels of the control signals supplied to the pixels 100 of the row, and the control signals to which the row numbers are not added indicate the levels of the control signals supplied to all the rows in common. Since the levels of the control signal RES and the control signal OFD are the same, the operation of these control signals is collectively illustrated as "RES/OFD" in FIG. 4.

At time t11, the control signal RES becomes the high level. Thus, in the pixels 100 of each row, the reset transistor M2 is turned on, and the potential of the floating diffusion FD is reset. At the time t11, the control signal OFD becomes the high level. Thus, in the pixels 100 of each row, the discharging transistor M5 is turned on, and the charges accumulated in the photoelectric conversion unit PD is discharged to the power supply potential node Vdd. By these operations, the photoelectric conversion unit PD is also reset.

At the time t1, the control signals RES and OFD become the low level. Thus, in the pixels 100 of each row, the reset transistor M2 and the discharging transistor M5 are turned off. Thus, in the pixels 100 of each row, the reset of the potential of the floating diffusion FD and the discharge of the charges accumulated in the photoelectric conversion unit PD are completed. In this manner, in the pixels 100 of each row, charge accumulation for generation of the gradation signal in the photoelectric conversion unit PD starts from the time t1.

At time t12, the control signal TX1 becomes the high level. Thus, in the pixels 100 of each row, the first transfer transistor M11 is turned on, and the charges accumulated in the photoelectric conversion unit PD starts to be transferred to the charge holding unit C1.

At the time t2, the control signal TX1 becomes the low level. Thus, in the pixels 100 of each row, the first transfer transistor M11 is turned off, and the charge transfer from the photoelectric conversion unit PD to the charge holding unit C1 is ended. In this manner, in the pixels 100 of each row, the charge accumulation for generating the gradation signal in the photoelectric conversion unit PD ends at the time t2. The period T1 between the time t1 and the time t2 is a charge accumulation period for generating the gradation signal. When the charge transfer is completed at the time t2, the photoelectric conversion unit PD enters the initial state again.

At the time t2, the charge holding unit C1 holds the charges transferred from the photoelectric conversion unit PD. In the period T2 from the time t2 to time t17, the gradation signals based on the charge are read in a row sequential manner from the first row to the n-th row.

At time t13, the control signal SEL(1) becomes the high level. As a result, the selection transistor M4 of the first row is turned on, the pixels 100 of the first row are selected, and the gradation signal can be output.

At time t14, the control signal TX2(1) becomes the high level. Thereby, the second transfer transistor M12 of the first row is turned on, and charges are transferred from the charge holding unit C1 of the first row to the floating diffusion FD of the first row. Thus, the potential of the output line VL changes according to the transferred charges.

At time t15, the control signal TX2(1) becomes the low level. Thereby, the second transfer transistor M12 of the first row is turned off, and the charge transfer ends. After that, the gradation signals are read from the pixels 100 in the first row to the gradation signal reading circuit 13 via the output lines VL.

At time t16, the control signal SEL(1) becomes the low level. Thus, the selection transistor M4 of the first row is turned off, and the pixels 100 of the first row are brought into a non-selected state. As described above, the gradation signals are read from the pixels 100 in the first row. Note that, the reset signal based on the reset state of the floating diffusion FD may be further read during a period between the time t13 and the time t14.

After the time t16, the gradation signals are read from the pixels 100 in the second row to the n-th row in a row sequential manner. Since the reading of these gradation signals is the same as in the first row, the description thereof will be omitted. At the time t17, the reading of the gradation signals from the pixels 100 of the n-th row ends. The period T2 between the time t2 and the time t17 is a period during which the gradation signals are read.

At time t3, the control signal TX3 becomes the high level. Thus, in the pixels 100 of each row, the third transfer transistor M13 is turned on, and the photoelectric conversion unit PD and the logarithmic transformation unit 101 are connected. Accordingly, in the pixels 100 of each row, the photocurrent Ip corresponding to the charges generated by the incident light to the photoelectric conversion unit PD can be detected by the logarithmic transformation unit 101. That is, detection of the event and reading of the event signal are started after the time t3.

After the time t3, the logarithmic transformation unit 101, the subtraction unit 102, and the comparison unit 103 perform event detection processing and event signal reading processing as follows. The logarithmic transformation unit 101 generates a potential corresponding to the photocurrent Ip and converts the potential into a logarithmic potential Vl. The subtraction unit 102 generates a difference potential Vd by subtracting the reference potential Vr from the logarithmic potential Vl. The comparison unit 103 compares the difference potential Vd with the positive threshold value and the negative threshold value. When the difference potential Vd is greater than the positive threshold value, the comparison unit 103 outputs the event signal to the event signal reading circuit 14 via the output line VLp. When the difference potential Vd is less than the negative threshold value, the comparison unit 103 outputs the event signal to the event signal reading circuit 14 via the output line VLn.

At the time t17, the control signal TX3 becomes the low level. Thereby, in the pixels 100 of each row, the third transfer transistor M13 is turned off, and the photoelectric conversion unit PD and the logarithmic transformation unit 101 are disconnected. The period T3 between the time t3 and the time t17 is a period for detecting the event and reading the event signal.

At time t18, the control signal RES becomes the high level. Thus, in the pixels 100 of each row, the reset transistor M2 is turned on, and the potential of the floating diffusion FD is reset. Further, at the time t18, the control signal OFD becomes the high level. Thus, in the pixels 100 of each row, the discharging transistor M5 is turned on, and the charges accumulated in the photoelectric conversion unit PD is discharged to the power supply potential node Vdd. Accordingly, the photoelectric conversion unit PD is also reset.

At the time t4, the control signals RES and OFD become the low level. As a result, in the pixels 100 of each row, the reset transistor M2 and the discharging transistor M5 are turned off, and charge accumulation for generating the gradation signals is started. As described above, the gradation signals and the event signal are read in one period VD from the time t1 to the time t4. Since the same operation is repeated after the time t4, description thereof will be omitted.

As described above, the photoelectric conversion device of the present embodiment performs charge accumulation for generation of the gradation signals, reading of the gradation signals, detection of the event, and reading of the event signal in the period VD between the time t1 and the time t4 as one cycle. At least a part of the period T2 and the period T3 overlap with each other. That is, in the period from the time t3 to the time t17, the reading of the gradation signal and the detection of the event and the reading of the event signal are performed in parallel. Therefore, it is possible to secure a long time in which the event can be detected in the period VD. Thus, according to the present embodiment, the photoelectric conversion device in which the possibility of event detection omission is reduced is provided.

Further, in the present embodiment, as illustrated in FIGS. 3 and 4, it is possible to match the period in which the event can be detected in each pixel 100. This makes it possible to match the event detection periods within the angle of view at which imaging is performed, thereby further reducing the possibility of event detection omission.

In imaging in an environment where the light amount is small, such as in a dark place, the amount of information of the gradation signal may be insufficient. In such a case, image data may be generated by adding a plurality of signals acquired in a plurality of periods VD in an addition circuit in the photoelectric conversion device or outside the photoelectric conversion device. Thus, imaging in an environment with a small light amount can be performed with high accuracy.

Further, a plurality of pieces of image data may be generated in which a ratio of the accumulation time of the gradation signal in one period VD to the time of detecting the event and reading the event signal is changed, and the image data may be generated with the ratio being variable. Further, the length of one period VD may be variable. According to these configurations, it is possible to generate appropriate image data according to the light amount of the environment.

In the photoelectric conversion device of the present embodiment, since the state is updated asynchronously in the photoelectric conversion device and the event signal is read at any time in the period in which the event detection and the event signal reading are performed, the delay time from the light amount change to the output of the event signal is short. Since the event detection often occurs in the pixel 100 corresponding to the vicinity of the edge of the moving object, the event signal is output sparsely in the pixel array 10. Therefore, since the signal processing at the time of outputting the event signal is executed sparsely at the time of occurrence of the event, the average power consumption of the photoelectric conversion device of the present embodiment is reduced.

The photoelectric conversion unit PD is connected to an arithmetic circuit (the logarithmic transformation unit 101, the subtraction unit 102, and the comparison unit 103) without a reading circuit. Therefore, the signal processing can be performed with a low delay, and the signal processing is less susceptible to a reduction in speed due to the transmission speed of the reading circuit. That is, even in an imaging environment in which many events are detected, processing delay in the photoelectric conversion device is less likely to occur. Further, since the spatial resolution and the temporal resolution of the event signal are roughened by the processing in the arithmetic circuit, the amount of information is reduced. For this reason, an interface having a relatively small communication capacity can be applied for transmission of the event signal, and power consumption for transmission is small.

The specific configuration of each of the logarithmic transformation unit 101, the subtraction unit 102, and the comparison unit 103 in the present embodiment is not particularly limited as long as equivalent calculation results (including approximate calculation results) are obtained. For example, each of the logarithmic transformation unit 101, the subtraction unit 102, and the comparison unit 103 may be an analog arithmetic unit, an asynchronous (clockless) digital arithmetic unit, or a clock synchronous digital arithmetic unit. Alternatively, each of the logarithmic transformation unit 101, subtraction unit 102, and comparison unit 103 may be a software implementation by a processor. Each of the logarithmic transformation unit 101, the subtraction unit 102, and the comparison unit 103 may be a combination of the above-described forms. Further, by using the above arithmetic unit in a time-division manner, it may be shared by a plurality of arithmetic processing. Further, the arithmetic order may be changed in the processing of the logarithmic transformation unit 101, the subtraction unit 102, and the comparison unit 103 illustrated in FIG. 2. For example, in the processing performed by the circuit of FIG. 2, the processing of subtracting the reference potential Vr from the logarithmic potential Vl may be replaced with the processing of adding the reference potential Vr to the threshold value. Since these processes are equivalent, they can be applied to the present embodiment.

Second Embodiment

In the present embodiment, an example in which the photoelectric conversion device of the first embodiment is a stacked type will be described. The description of elements common to those of the first embodiment may be omitted or simplified as appropriate.

Figure 5:
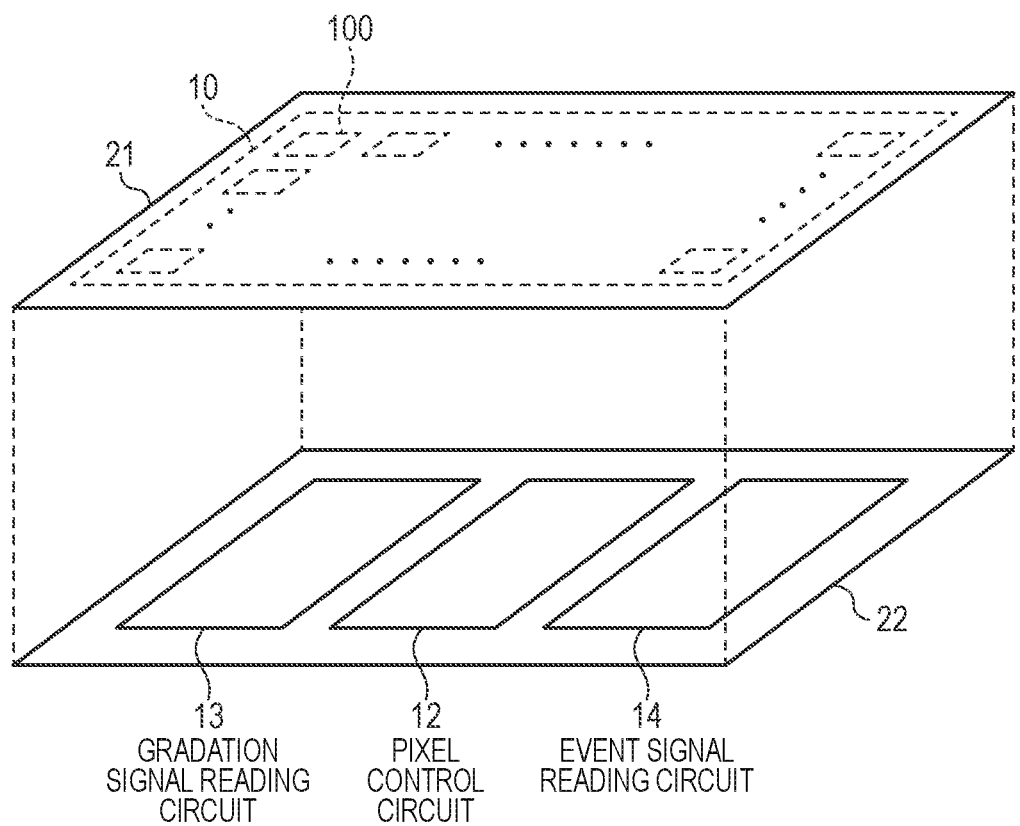
FIG. 5 is a schematic diagram illustrating a schematic configuration of a photoelectric conversion device according to a second embodiment.

FIG. 5 is a schematic diagram illustrating a schematic configuration of the photoelectric conversion device according to the present embodiment. The photoelectric conversion device of the present embodiment is a stacked photoelectric conversion device having a structure in which a plurality of substrates are stacked. As illustrated in FIG. 5, the photoelectric conversion device of the present embodiment has a structure in which a first substrate 21 and a second substrate 22 are stacked.

The pixel array 10 including the plurality of pixels 100 arranged to form a plurality of rows and a plurality of columns is arranged in the first substrate 21. The pixel control circuit 12, the gradation signal reading circuit 13, and the event signal reading circuit 14 are arranged in the second substrate 22. The gradation signal and the event signal output from the pixels 100 of the first substrate 21 are read to the circuit of the second substrate 22. The configurations and operations of the pixel 100, the pixel control circuit 12, the gradation signal reading circuit 13, and the event signal reading circuit 14 are the same as those of the first embodiment, and a description thereof will be omitted. Each of the first substrate 21 and the second substrate 22 is typically a semiconductor substrate mainly containing silicon. Note that the substrates are not limited to this example, and each of the first substrate 21 and the second substrate 22 may be a silicon on insulator (SOI) substrate or a gallium arsenide substrate. Further, the first substrate 21 and the second substrate 22 may be substrates mainly containing different materials each other. For example, the first substrate 21 may be a semiconductor substrate mainly containing silicon, and the second substrate 22 may be a gallium arsenide substrate.

The wiring layer of the first substrate 21 is arranged on the surface on the side to be bonded to the second substrate 22, and the light incident surface of the first substrate 21 is the surface opposite to the surface on the side to be bonded to the second substrate 22. That is, the photoelectric conversion device of the present embodiment is a so-called back-illuminated type.

In the present embodiment, a photoelectric conversion device capable of obtaining the same effect as in the first embodiment is provided. Further, in the present embodiment, by arranging the pixel control circuit 12, the gradation signal reading circuit 13, the event signal reading circuit 14, and the like on a substrate different from a substrate in which the pixel array 10 is arranged, the area of the photoelectric conversion device can be reduced while maintaining the area of the pixel array 10.

Although the output lines VL, VLp, and VLn are not illustrated in FIG. 5, they may be arranged in the first substrate 21, the second substrate 22, or both of the first substrate 21 and the second substrate 22. Although the timing control circuit 11 is not illustrated in FIG. 5, it may be arranged in the first substrate 21, the second substrate 22, or the outside of the photoelectric conversion device.

Third Embodiment

In the present embodiment, a modified example of the stacked photoelectric conversion device of the second embodiment will be described. In the present embodiment, a part of the circuits constituting the pixel 100 is arranged in the first substrate 21, and another part of the circuits is arranged in the second substrate 22. The description of elements common to those of the second embodiment may be omitted or simplified as appropriate.

Figure 6:
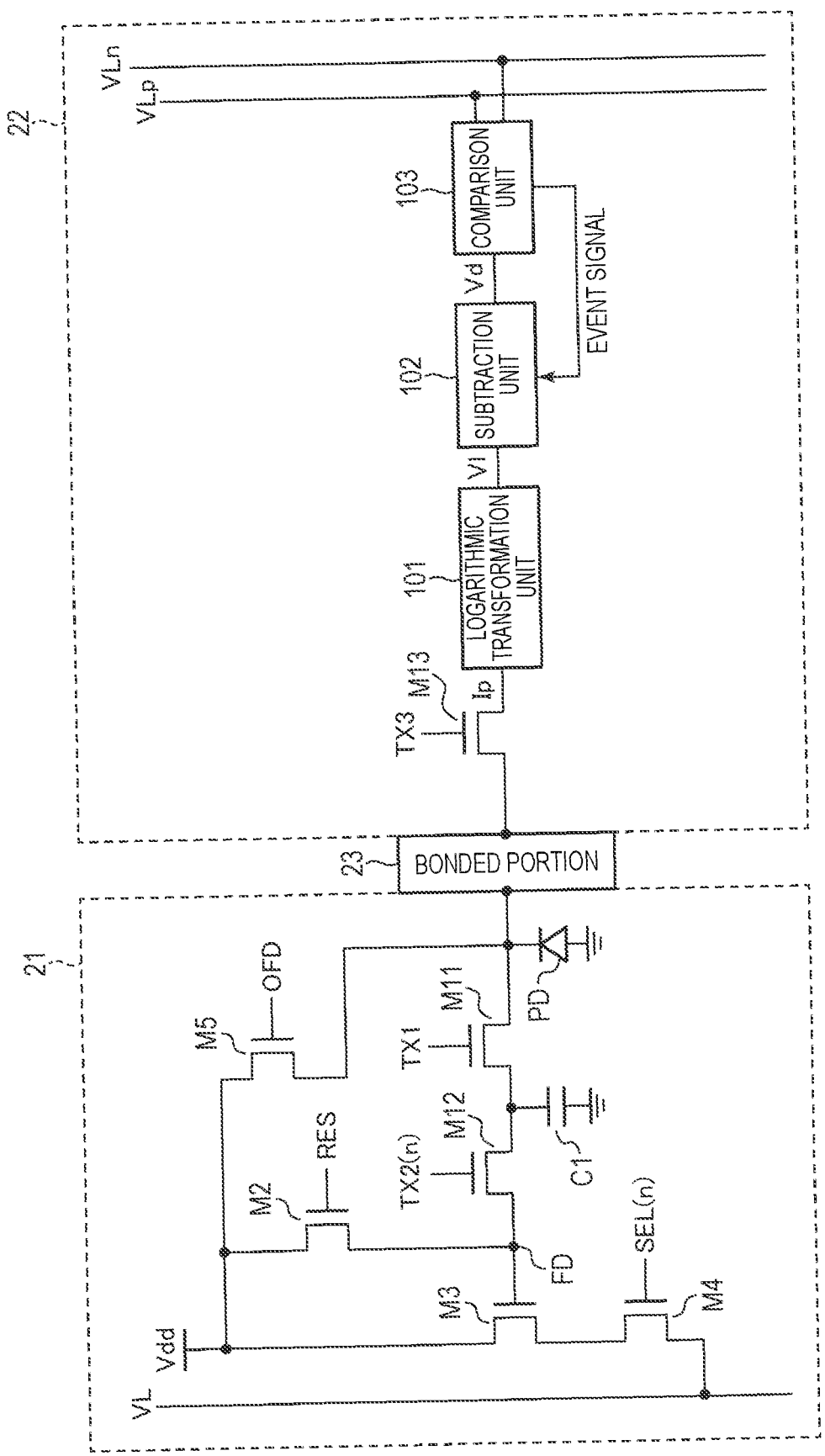
FIG. 6 is a circuit diagram illustrating a configuration example of a pixel according to a third embodiment.

FIG. 6 is a circuit diagram illustrating a configuration example of the pixel 100 according to the present embodiment. The photoelectric conversion unit PD, the charge holding unit C1, the first transfer transistor M11, the second transfer transistor M12, the reset transistor M2, the amplification transistor M3, the selection transistor M4, and the discharging transistor M5 are arranged in the first substrate 21. The third transfer transistor M13, the logarithmic transformation unit 101, the subtraction unit 102, and the comparison unit 103 are arranged in the second substrate 22.

The first substrate 21 and the second substrate 22 are bonded to each other at a bonded portion 23. The bonded portion 23 electrically connects the cathode of the photoelectric conversion unit PD and the source of the third transfer transistor M13. The bonded portion 23 may be, for example, a Cu—Cu bonding.

Also in this embodiment, the same effect as in the first embodiment and the second embodiment can be obtained. Further, in the present embodiment, it is possible to reduce the influence caused by crosstalk into the charge holding unit C1 of the switching operation of the third transfer transistor M13 or crosstalk into the charge holding unit C1 of the variation of the current flowing through the third transfer transistor M13 when the event is detected. Thus, it is possible to reduce the influence of the detection of the event on the accuracy of the gradation signal.

The charge holding unit C1 may not be arranged in the first substrate 21, and may be formed in a wiring layer provided between the first substrate 21 and the second substrate 22. In this case, the charge holding unit C1 may be formed of a plurality of metal wirings sandwiching an insulating film in the same wiring layer. Alternatively, the charge holding unit C1 may be formed by arranging a metal wiring of one wiring layer among a plurality of wiring layers and a metal wiring of another wiring layer so as to sandwich an insulating film.

Fourth Embodiment

In the present embodiment, another modification of the stacked photoelectric conversion device of the second embodiment will be described. In the present embodiment, the circuits included in the first substrate 21 and the second substrate 22 are different from those in the third embodiment. Elements common to the second embodiment or the third embodiment may be appropriately omitted or simplified.

Figure 7:
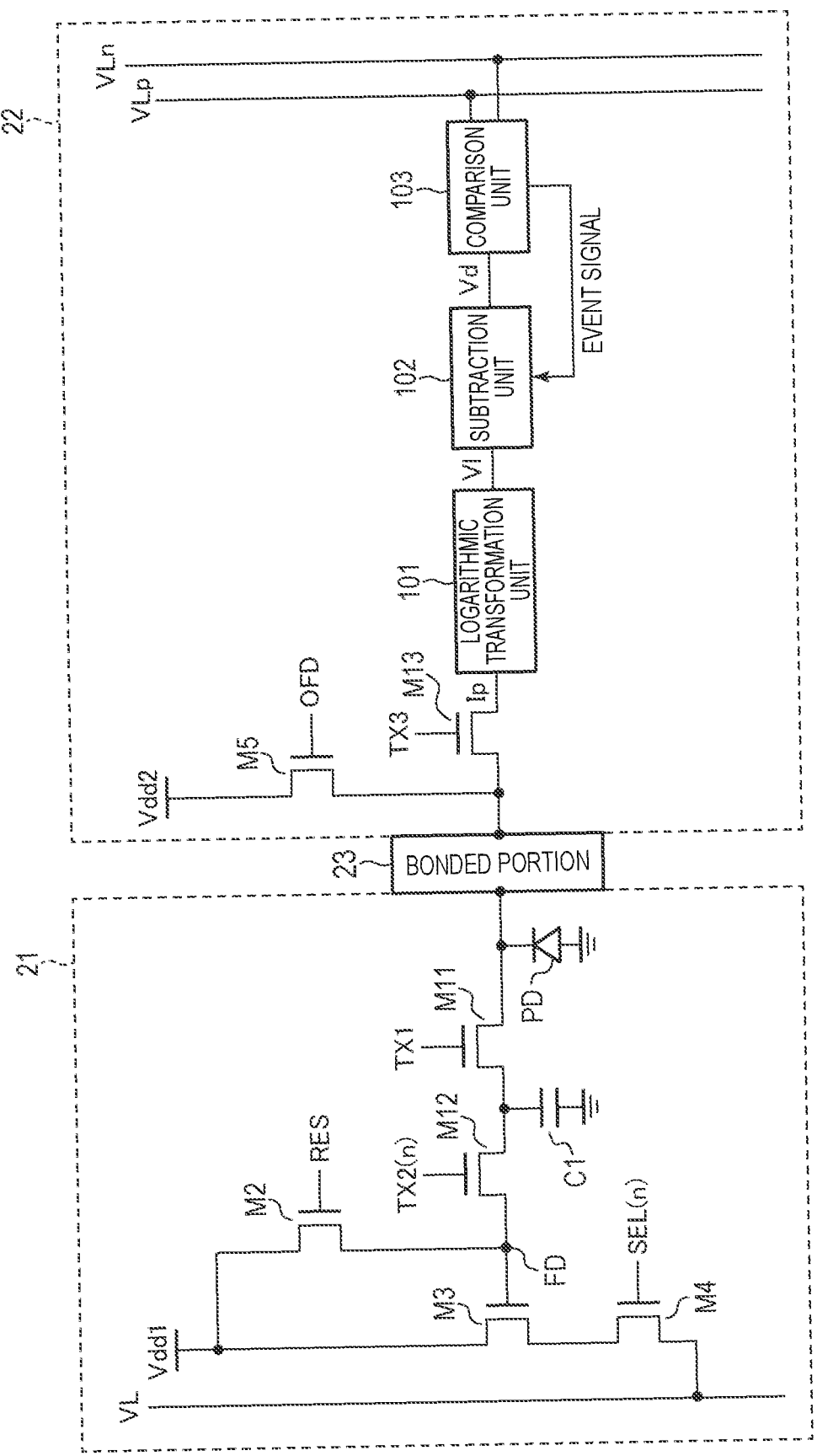
FIG. 7 is a circuit diagram illustrating a configuration example of a pixel according to a fourth embodiment.

FIG. 7 is a circuit diagram illustrating a configuration example of the pixel 100 according to the present embodiment. In the present embodiment, the discharging transistor M5 is arranged in the second substrate 22. The drain of the reset transistor M2 and the drain of the amplification transistor M3 are connected to a power supply potential node Vdd1 of the first substrate 21 to which the power supply potential is supplied. The drain of the discharging transistor M5 is connected to the power supply potential node Vdd2 of the second substrate 22 to which the power supply potential is supplied.

Also in this embodiment, the same effect as in the first to third embodiments can be obtained. Further, in the present embodiment, it is possible to reduce the influence caused by crosstalk into the charge holding unit C1 of the variation of the current flowing through the discharging transistor M5. Thus, it is possible to further reduce the influence of the detection of the event on the accuracy of the gradation signal.

The combination of the circuits included in each of the first substrate 21 and the second substrate 22 and the position of the bonded portion 23 are not limited to those described in the third embodiment and the fourth embodiment. For example, the bonded portion 23 may be provided inside the logarithmic transformation unit 101.

In the second to fourth embodiments, the first substrate 21 and the second substrate 22 are stacked, but the number of stacked substrates is not limited thereto. For example, three or more substrates may be stacked.

Fifth Embodiment

Figure 8:
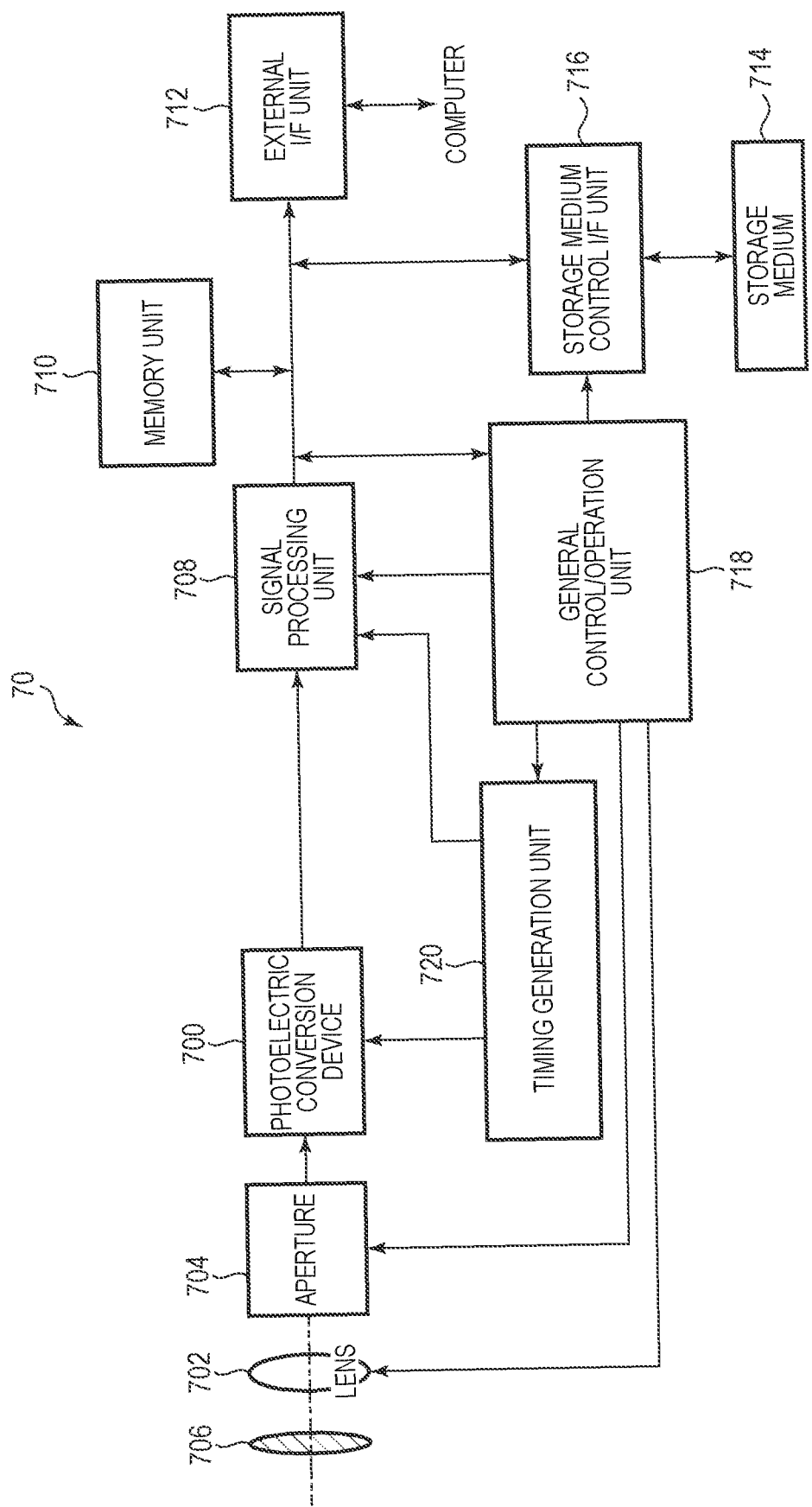
FIG. 8 is a block diagram of equipment according to a fifth embodiment.

The photoelectric conversion device of the above embodiments can be applied to various equipment. Examples of the equipment include a digital camera, a digital camcorder, a camera head, a copying machine, a facsimile, a mobile phone, a vehicle-mounted camera, an observation satellite, and a surveillance camera. FIG. 8 is a block diagram of a digital camera as an example of equipment.

The equipment 70 illustrated in FIG. 8 includes a barrier 706, a lens 702, an aperture 704, and a photoelectric conversion device 700. The equipment 70 further includes a signal processing unit (processing device) 708, a timing generation unit 720, a general control/operation unit 718 (control device), a memory unit 710 (storage device), a storage medium control I/F unit 716, a storage medium 714, and an external I/F unit 712. At least one of the barrier 706, the lens 702, and the aperture 704 is an optical device corresponding to the equipment. The barrier 706 protects the lens 702, and the lens 702 forms an optical image of an object on the photoelectric conversion device 700. The aperture 704 varies the amount of light passing through the lens 702. The photoelectric conversion device 700 is configured as in the above embodiments, and converts an optical image formed by the lens 702 into image data (image signal). The signal processing unit 708 performs various corrections, data compression, and the like on the image data output from the photoelectric conversion device 700. The timing generation unit 720 outputs various timing signals to the photoelectric conversion device 700 and the signal processing unit 708. The general control/operation unit 718 controls the entire digital camera, and the memory unit 710 temporarily stores image data. The storage medium control I/F unit 716 is an interface for storing or reading image data on the storage medium 714, and the storage medium 714 is a detachable storage medium such as a semiconductor memory for storing or reading image data. The external I/F unit 712 is an interface for communicating with an external computer or the like. The timing signal or the like may be input from the outside of the equipment. The equipment 70 may further include a display device (a monitor, an electronic view finder, or the like) for displaying information obtained by the photoelectric conversion device. The equipment includes at least a photoelectric conversion device. Further, the equipment 70 includes at least one of an optical device, a control device, a processing device, a display device, a storage device, and a mechanical device that operates based on information obtained by the photoelectric conversion device. The mechanical device is a movable portion (for example, a robot arm) that receives a signal from the photoelectric conversion device for operation.

Each pixel circuit may include a plurality of photoelectric conversion units (a first photoelectric conversion unit and a second photoelectric conversion unit). The signal processing unit 708 may be configured to process a pixel signal based on charges generated in the first photoelectric conversion unit and a pixel signal based on charges generated in the second photoelectric conversion unit, and acquire distance information from the photoelectric conversion device 700 to an object.

Sixth Embodiment

Figure 9A:
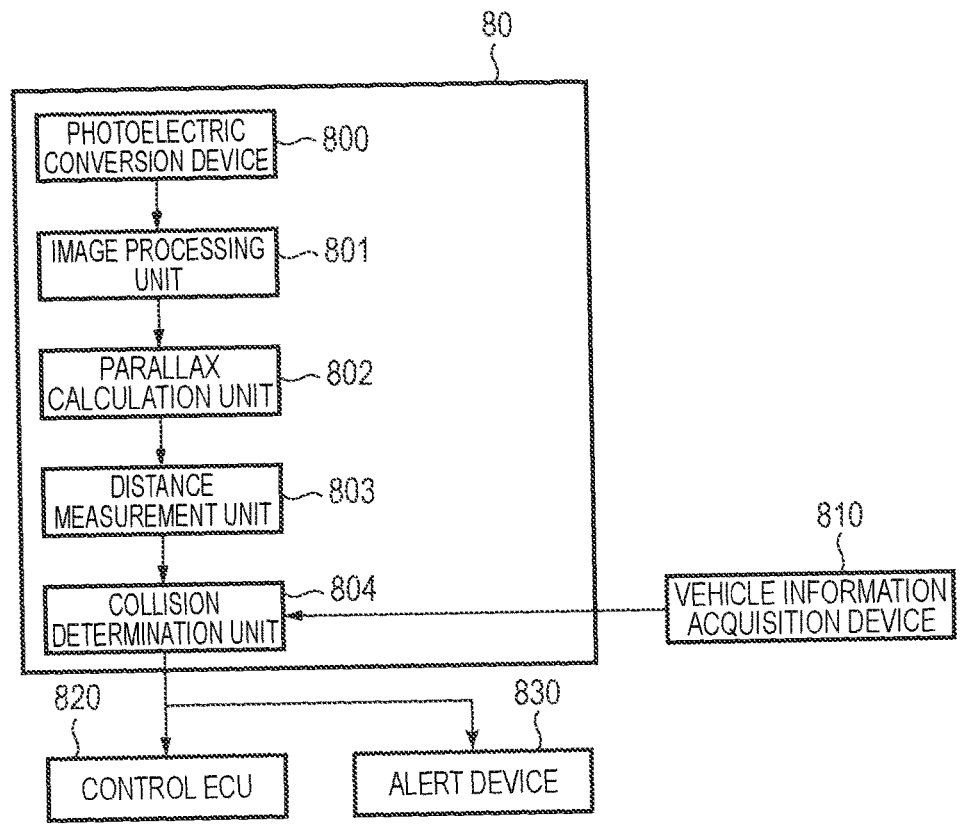
FIGS. 9A and 9B are block diagrams of equipment according to a sixth embodiment.
Figure 9B:
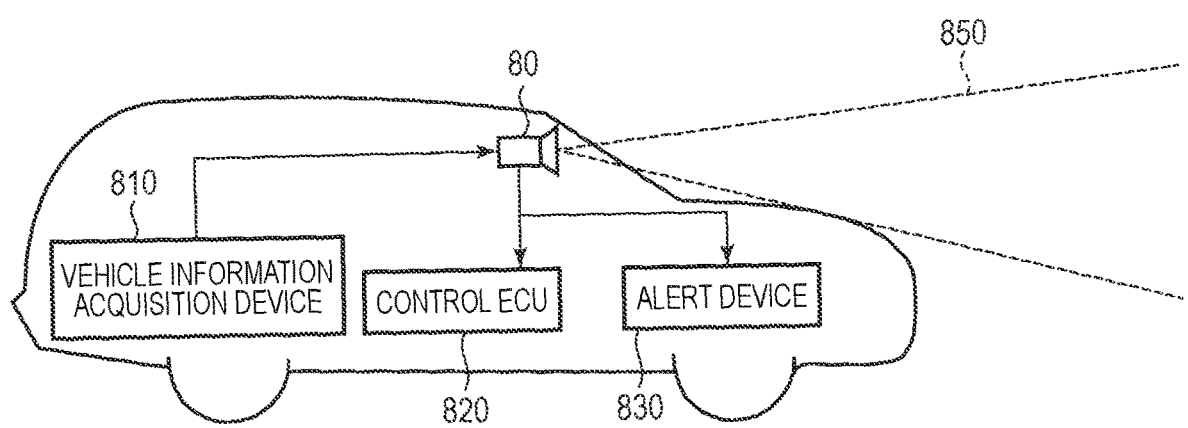

FIGS. 9A and 9B are block diagrams of equipment relating to the vehicle-mounted camera according to the present embodiment. The equipment 80 includes a photoelectric conversion device 800 of the above embodiments and a signal processing device (processing device) that processes a signal from the photoelectric conversion device 800. The equipment 80 includes an image processing unit 801 that performs image processing on a plurality of pieces of image data acquired by the photoelectric conversion device 800, and a parallax calculation unit 802 that calculates parallax (phase difference of parallax images) from the plurality of pieces of image data acquired by the equipment 80. The equipment 80 includes a distance measurement unit 803 that calculates a distance to an object based on the calculated parallax, and a collision determination unit 804 that determines whether or not there is a possibility of collision based on the calculated distance. Here, the parallax calculation unit 802 and the distance measurement unit 803 are examples of a distance information acquisition unit that acquires distance information to the object. That is, the distance information is information on a parallax, a defocus amount, a distance to the object, and the like. The collision determination unit 804 may determine the possibility of collision using any of these pieces of distance information. The distance information acquisition unit may be realized by dedicatedly designed hardware or software modules. Further, it may be realized by a field programmable gate array (FPGA), an application specific integrated circuit (ASIC) or a combination thereof.

The equipment 80 is connected to the vehicle information acquisition device 810, and can obtain vehicle information such as a vehicle speed, a yaw rate, and a steering angle. Further, the equipment 80 is connected to a control ECU 820 which is a control device that outputs a control signal for generating a braking force to the vehicle based on the determination result of the collision determination unit 804. The equipment 80 is also connected to an alert device 830 that issues an alert to the driver based on the determination result of the collision determination unit 804. For example, when the collision possibility is high as the determination result of the collision determination unit 804, the control ECU 820 performs vehicle control to avoid collision or reduce damage by braking, returning an accelerator, suppressing engine output, or the like. The alert device 830 alerts the user by sounding an alarm such as a sound, displaying alert information on a screen of a car navigation system or the like, or giving vibration to a seat belt or a steering wheel. The equipment 80 functions as a control unit that controls the operation of controlling the vehicle as described above.

In the present embodiment, an image of the periphery of the vehicle, for example, the front or the rear is captured by the equipment 80. FIG. 9B illustrates equipment in a case where an image is captured in front of the vehicle (image capturing range 850). The vehicle information acquisition device 810 as the imaging control unit sends an instruction to the equipment 80 or the photoelectric conversion device 800 to perform the imaging operation. With such a configuration, the accuracy of distance measurement can be further improved.

Although the example of control for avoiding a collision to another vehicle has been described above, the embodiment is applicable to automatic driving control for following another vehicle, automatic driving control for not going out of a traffic lane, or the like. Furthermore, the equipment is not limited to a vehicle such as an automobile and can be applied to a movable body (movable apparatus) such as a ship, an airplane, a satellite, an industrial robot and a consumer use robot, or the like, for example. In addition, the equipment can be widely applied to equipment which utilizes object recognition or biometric authentication, such as an intelligent transportation system (ITS), a surveillance system, or the like without being limited to movable bodies.

Modified Embodiments

The present invention is not limited to the above embodiments, and various modifications are possible. For example, an example in which some of the configurations of any one of the embodiments are added to other embodiments or an example in which some of the configurations of any one of the embodiments are replaced with some of the configurations of other embodiments are also embodiments of the present invention.

The disclosure of this specification includes a complementary set of the concepts described in this specification. That is, for example, if a description of "A is B" (A=B) is provided in this specification, this specification is intended to disclose or suggest that "A is not B" even if a description of "A is not B" (A≠B) is omitted. This is because it is assumed that "A is not B" is considered when "A is B" is described.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2023-022557, filed Feb. 16, 2023, which is hereby incorporated by reference herein in its entirety.

What is claimed is:

1. A photoelectric conversion device comprising a plurality of pixels, each of the plurality of pixels including:
   a photoelectric conversion unit configured to generate charges according to incident light;
   a charge holding unit;
   a first transfer transistor configured to transfer charges from the photoelectric conversion unit to the charge holding unit;
   a second transfer transistor configured to transfer charges from the charge holding unit to a first node;
   a third transfer transistor configured to transfer charges from the photoelectric conversion unit to a second node; and
   a discharging transistor configured to discharge charges in the photoelectric conversion unit,
   wherein in one of the plurality of pixels, first reading processing of reading a gradation signal indicating a light amount of the incident light based on the charges transferred to the first node and second reading processing of reading an event signal indicating a change in the light amount of the incident light based on the charges transferred to the second node are performed in parallel,
   wherein a first timing at which the discharging transistor ends discharging charges is common in each of the plurality of pixels,
   wherein a second timing at which the first transfer transistor ends transferring charges from the photoelectric conversion unit to the charge holding unit is common in each of the plurality of pixels, and
   wherein the third transfer transistor of each of the plurality of pixels simultaneously turns on after the second timing.

2. The photoelectric conversion device according to claim 1, wherein in each of the plurality of pixels, the second reading processing is performed in parallel.

3. The photoelectric conversion device according to claim 1, wherein in each of the plurality of pixels, the first reading processing is performed in different periods.

4. The photoelectric conversion device according to claim 1, wherein in the one of the plurality of pixels, the second transfer transistor is turned on in a period in which the third transfer transistor is in an on-state.

5. The photoelectric conversion device according to claim 1,
   wherein the plurality of pixels are arranged in a plurality of rows and a plurality of columns,
   wherein each of the plurality of pixels further includes a reset transistor configured to reset a potential of the first node, and
   wherein a period from an end of resetting the potential of the first node to an end of transferring charges by the first transfer transistor is common in each of the plurality of pixels.

6. The photoelectric conversion device according to claim 1, wherein each of the plurality of pixels further includes an amplification transistor configured to output a potential corresponding to the charges transferred to the first node.

7. The photoelectric conversion device according to claim 1, wherein each of the plurality of pixels further includes a comparison unit configured to compare a temporal change of a signal according to the charges transferred to the second node with a threshold value to output a comparison result as the event signal.

8. The photoelectric conversion device according to claim 7, wherein an output signal of the comparison unit is output to different output lines when the temporal change is greater than a first threshold value and when the temporal change is less than a second threshold value that is less than the first threshold value.

9. The photoelectric conversion device according to claim 7 further comprising a logarithmic transformation unit configured to output a logarithm of a signal based on the charges transferred to the second node.

10. The photoelectric conversion device according to claim 7 further comprising a subtraction unit configured to calculate the temporal change based on a difference between a signal corresponding to the charges transferred to the second node and a reference signal based on a past event signal.

11. The photoelectric conversion device according to claim 1, wherein the photoelectric conversion unit is arranged in a first substrate, and
wherein the gradation signal and the event signal are read to a second substrate stacked on the first substrate.

12. The photoelectric conversion device according to claim 11, wherein a control circuit configured to control the first reading processing and the second reading processing is arranged in the second substrate.

13. The photoelectric conversion device according to claim 1,
wherein the photoelectric conversion unit is arranged in a first substrate, and
wherein the third transfer transistor is arranged in a second substrate stacked on the first substrate.

14. The photoelectric conversion device according to claim 13, wherein the charge holding unit is arranged in the first substrate.

15. The photoelectric conversion device according to claim 13, wherein the charge holding unit is provided in a wiring layer arranged between the first substrate and the second substrate.

16. The photoelectric conversion device according to claim 13, wherein a bonded portion between the first substrate and the second substrate is arranged at a node between the photoelectric conversion unit and the third transfer transistor.

17. The photoelectric conversion device according to claim 13,
wherein each of the plurality of pixels further includes a discharging transistor configured to discharge charges of the photoelectric conversion unit, and
wherein the discharging transistor is arranged in the first substrate.

18. The photoelectric conversion device according to claim 13,
wherein each of the plurality of pixels further includes a discharging transistor configured to discharge charges of the photoelectric conversion unit, and
wherein the discharging transistor is arranged in the second substrate.

19. Equipment comprising:
the photoelectric conversion device according to claim 1; and
at least any one of:
an optical device adapted for the photoelectric conversion device,
a control device configured to control the photoelectric conversion device,
a processing device configured to process a signal output from the photoelectric conversion device,
a display device configured to display information obtained by the photoelectric conversion device,
a storage device configured to store information obtained by the photoelectric conversion device, and
a mechanical device configured to operate based on information obtained by the photoelectric conversion device.

20. The equipment according to claim 19, wherein the processing device processes image signals that are generated by a plurality of photoelectric conversion units, respectively, and acquires distance information on a distance from the photoelectric conversion device to an object.

* * * * *